United States Patent [19]

See et al.

[11] 4,418,094

[45] Nov. 29, 1983

[54] VERTICAL-ETCH DIRECT MOAT ISOLATION PROCESS

[75] Inventors: Yee-Chaung See, Plano; Roderick D. Davies, Richardson; Dennis C. Hartman, Plano, all of Tex.

[73] Assignee: Texas Instruments Incorporated, Dallas, Tex.

[21] Appl. No.: 353,994

[22] Filed: Mar. 2, 1982

[51] Int. Cl.³ .............................................. H01L 27/00
[52] U.S. Cl. ...................................... 427/38; 427/39; 427/45.1; 427/99
[58] Field of Search ...................... 427/99, 38, 45.1, 39

[56] References Cited

PUBLICATIONS

Parrillo et al., "Twin-Tub CMOS-A Technology for VLSI Circuits", 1980 IEDM, Paper No. 29.1.
Kahng et al., "A Method for Area Saving Planar Isolation Oxides Wing Oxidation Protected Sidewalls", J. Electrochem. Soc.: Solid State Sci. & Tech., vol. 127, pp. 2468–2471, (1980).
Kurosawa et al., "A New Buried-Oxide Field Isolation for VSLI Devices", 1981 Device Research Conference.

Primary Examiner—James R. Hoffman
Attorney, Agent, or Firm—James T. Comfort; Robert O. Groover, III; Melvin Sharp

[57] ABSTRACT

Direct Moat Isolation for VLSI integrated circuit structures is formed by growing oxide over the entire substrate area, and then cutting windows in the oxide, using an anisotropic polymer-free oxide etch, where moat regions are to be formed. To prevent polysilicon filamentation, gate patterning is performed with an extremely selective polysilicon etch. The combination of these processing steps permits a direct moat isolation device fabrication process which is insensitive to the oxide sidewall angle, increasing yield and permitting extremely compact isolation structures to be formed.

9 Claims, 9 Drawing Figures

VERTICAL-ETCH DIRECT MOAT ISOLATION PROCESS

BACKGROUND OF THE INVENTION

The present invention relates to a method for fabricating high-density VLSI device structures.

The incessant trend towards smaller device geometries is ceasing to produce major area economies in the density of entire integrated circuits, because the isolation technologies currently used do not scale advantageously. LOCOS isolation creates a bird's-beak region around the periphery of every moat, and the width of this bird's-beak region is dependent only on the thickness of the field oxide. For a given operation voltage, the oxide thickness must remain at a certain minimum height to maintain sufficient field thresholds, so as to prevent formation of parasitic channels underneath the field oxide. Thus, for a given voltage of operation, the scalability of LOCOS is inherently limited. Therefore, a new and different isolation scheme is essential to achieve true very large scale integration.

One possibility for a new isolation technology is direct moat isolation. The merits of and the need for direct moat isolation are extensively discussed in U.S. patent application Ser. No. 353,992, simultaneously filed and of common assignee with the present application, which is hereby incorporated by reference. In addition, the drawings in the Parillo et al paper presented at the 1980 IEDM as Paper No. 29.1, appear to rely on use of some variant of a direct moat isolation scheme.

Direct moat isolation permits a single implant everywhere to serve a dual function. In the thick oxide regions, it serves as a channel stop implant, whereas in the active device area, it serves as a deep channel implant for punchthrough protection. Additional channel implants are performed to adjust the threshold voltage ($V_T$) of active devices. The higher doping in the channel, compared to the channel stop, is justified for a 1-micron technology because it can be shown that the dopant concentration (assumed to be uniform for simplicity) of the channel stop ($N_{A,Thick}$) and the dopant concentration of the active device region ($N_{A,Thin}$) can be related to the field oxide thickness ($d_{Thick}$) and gate oxide thickness ($d_{Thin}$) as follows (assuming $V_{T,Thin}=0.5$ V, $V_{T,Thick}<10$ V, interface charge density $N_f=5\times10^{10}$ cm$^{-2}$, and ignoring short channel effects)

$$\frac{N_{A,Thick}}{N_{A,Thin}} > \left(15 \times \frac{d_{Thin}}{d_{Thick}}\right)^2$$

For $d_{Thin}=250$ Angstroms and $d_{Thick}=5500$ Angstroms, this means that $$N_{A,Thick}/N_{A,Thin} > 0.46$$

Thus, unlike earlier n-channel implementations which required $N_{a,Thick}>N_{A,Thin}$ (and in fact required the invention of LOCOS to accomplish this), scaled technologies are less restrictive. Therefore, the continuity of the combined channel-stop/punchthrough implant at the edge of the channel width will reduce the lateral doping non-uniformity resulting in reduced electrical encroachment of the channel width. Furthermore, because of the etching process used in the direct moat isolation, the active area is not encroached upon by the field oxide as in the case of LOCOS. Therefore, the direct moat isolation enables more efficient usage of the silicon area by allowing closer packing of active devices than the LOCOS.

Other proposals for new isolation schemes include, e.g., the fully framed fully recessed oxide approach using sidewall nitride, published in 127 J. Electrochem. Soc. 2468 (1980), and the proposed recessed oxide by liftoff approach, presented by Kurosawa et al at the 1981 Device Research Conference.

Most approaches other than direct moat isolation involve complex processing and thus have very questionable cost effectiveness. Most of these approaches, except possibly the F$^3$R approach, still leave moat encroachments of less than a half micron very difficult to achieve.

However, a difficulty with direct moat isolation is that step coverage of the moat sidewalls becomes a problem. This is not a difficulty in LOCOS, because the moat encroachment naturally leads to a tapered oxide geometry. The direct moat isolation process disclosed in copending application Ser. No. 353,992 provides a direct moat isolation process which also achieves control of the oxide sidewall slope. However, a process which imposes a maximum sidewall slope not only imposes additional constraints on processing (and therefore lower yield), but also may not take full advantage of the compact isolation which is possible.

Thus, it is an object of the present invention to provide a method for fabricating VLSI devices using direct moat isolation which does not impose any constraint on sidewall slope.

It is a further object of the present invention to provide a process for fabricating VLSI devices using direct moat isolation with near-vertical oxide sidewalls.

It is a further object of the present invention to provide a process for fabricating VLSI devices using direct moat isolation with minimal process complexity.

SUMMARY OF THE INVENTION

The present invention teaches a combination of two distinctive etches to provide a direct moat isolation technology which does not require precise control of the oxide sidewall slope. This is accomplished by means of a polymer-free anisotropic oxide etch to cut the moat openings, with an exceedingly selective etch to define the polysilicon gates. Thus polysilicon filamentation is removed, since the overetch necessary to clear vertical sidewalls is practicable.

According to the present invention, there is provided:

a process for forming integrated circuit device structures, comprising the steps of:
  providing a silicon substrate;
  forming a uniform oxide layer on said substrate;
  etching windows in said oxide to expose selected moat regions of said substrate;
  forming a thin gate oxide layer within said respective moat regions;
  depositing polysilicon on exposed surfaces;
  patterning said polysilicon to define selected gate regions within said moat regions;
  etching said polysilicon where exposed by said gate patterning step;
  forming a plurality of respective sources and drains within respective ones of said moats; and forming a plurality of respective contacts to respective ones of said sources, drain, and gate, wherein said oxide etch is anisotropic and selective over silicon, and does not deposit substantial quantities of polymers in said moat regions;

and wherein said polysilicon etch is anisotropic and has a selectivity over oxide which is greater than 15;

whereby an MOS integrated circuit structure is formed.

BRIEF DESCRIPTION OF THE DRAWINGS

The present invention will be described with reference to the accompanying drawings, wherein.

DESCRIPTION OF THE PREFERRED EMBODIMENTS

Figure 1:
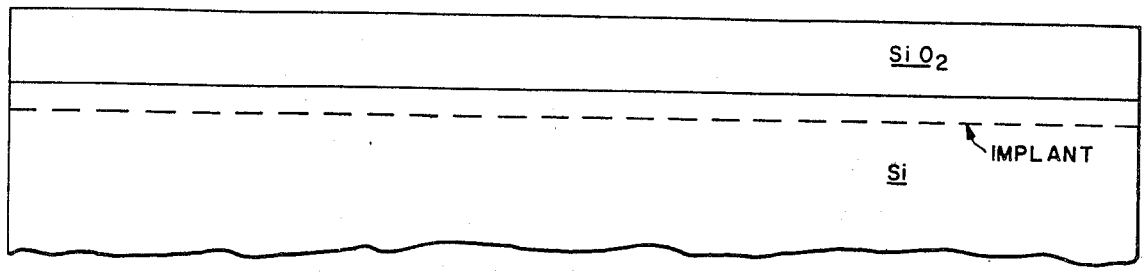
FIG. 1 shows the first step in the process of the present invention, wherein a blanket device threshold/channel stop is performed and a uniform field oxide grown.

To fabricate VLSI device structures according to the present invention, an oxide layer ofe.g. 500–800 nm thick is first grown uniformly over the whole surface of a wafer, as shown in FIG. 1. Moat areas are then patterned, and the moats are cut using anisotropic oxide etch. In the presently preferred embodiment, this is done in a single slice reactor using a $C_2F_6$ etchant with a small admixture of $CHF_3$. The $C_2F_6$ is flowed at about 240 sccm, and the $CHF_3$ is flowed at about 100 sccm. A 1900 sccm flow of a helium buffer is also used, bringing the total pressure up to about 10 Torr at a power of about 1000 watts. However, a wide variety of other etchants may be used. The key features required of an etch for use at this step of the present invention are that:

1. the etch must not deposit polymers in the cleared moat area;
2. the etch should have high selectivity for oxide over silicon, so that the etch stops cleanly on silicon; and
3. the etch should have high anisotropy.

For example, a T 8110 reactor oxide etch (RIE) is alternatively used.

The requirement of a polymer-free moat is critical. Normally oxide etches use controlled polymerization to achieve selectivity over silicon. That is, the gas used for etching includes a polymerizing species, but polymerization is suppressed by the oxygen released during the oxide etch. When the etch gas mixture reaches silicon, where free oxygen is not available, polymerization is no longer suppressed; so that silicon etching is suppressed by an inert polymer sheath. Thus all conventional selective oxide etches are inherently prone to deposit polymers on the exposed silicon surface. Since these polymers are fluorocarbons, and thus chemically inert, it is difficult to remove them. Polymer lumps will prevent formation of a good gate dielectric.

Figure 2:
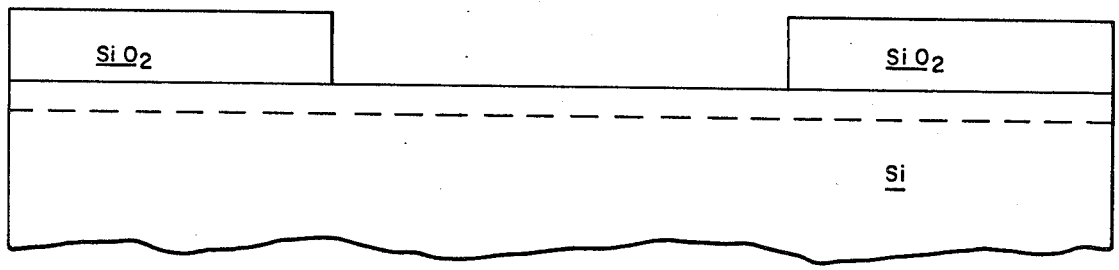
FIG. 2 shows the moat etching step.
Figure 3:
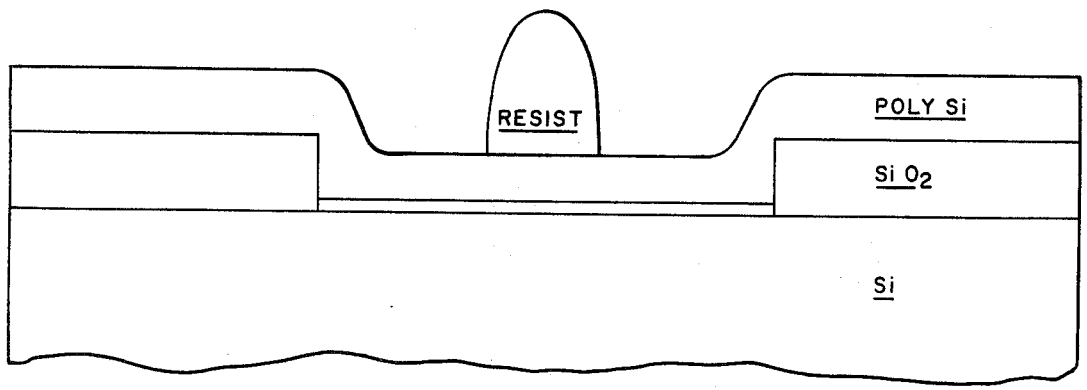
FIG. 3 shows gate-level patterning.
Figure 4:
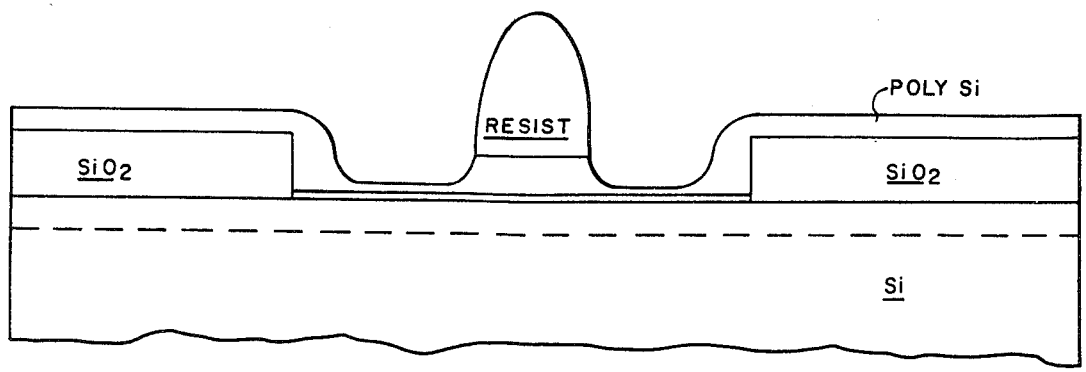
FIG. 4 show the gate partially completed.
Figure 5:
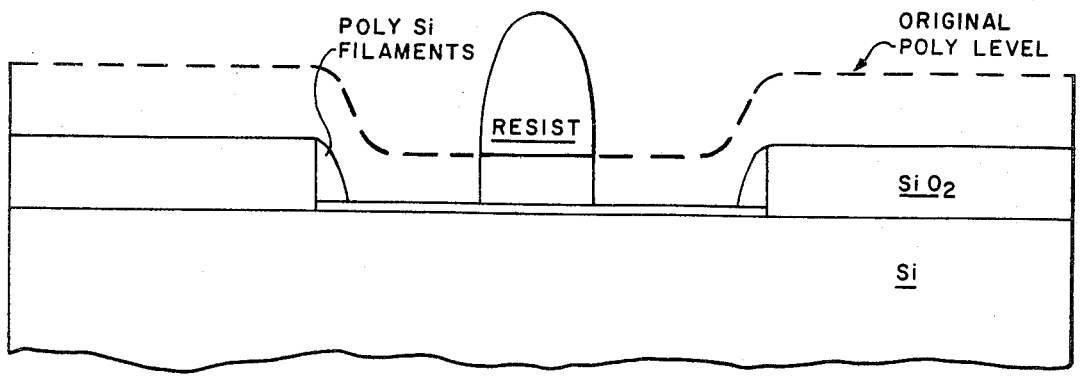
FIG. 5 shows the gate etch nominally completed, before the sidewall filaments have been cleared by overetching.
Figure 6:
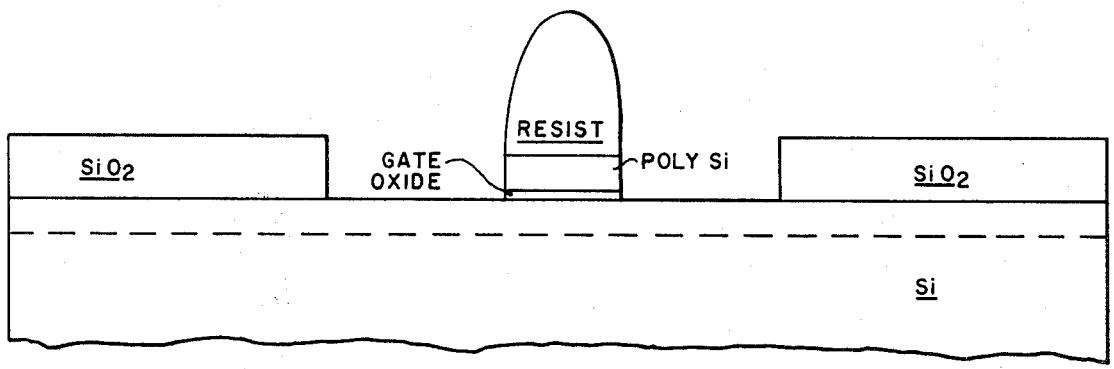
FIG. 6 shows the fully completed gate etch.
Figure 7:
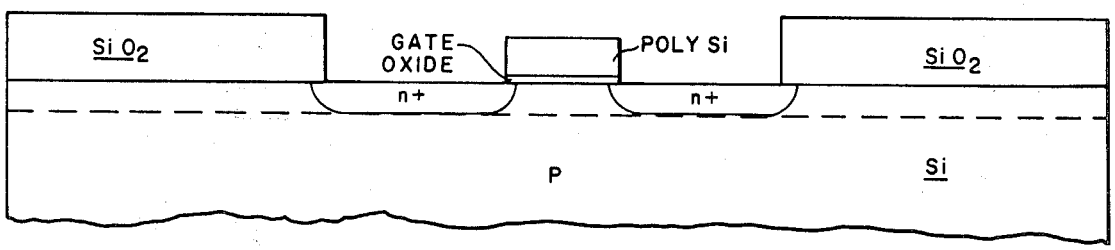
FIG. 7 shows formation of device sources and drains.
Figure 8:
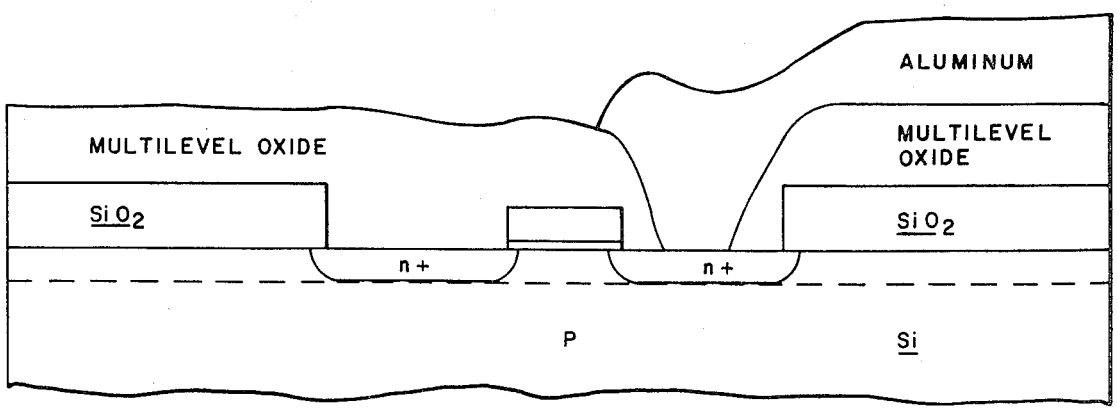
FIG. 8 shows formation of metal contacts.
Figure 9:
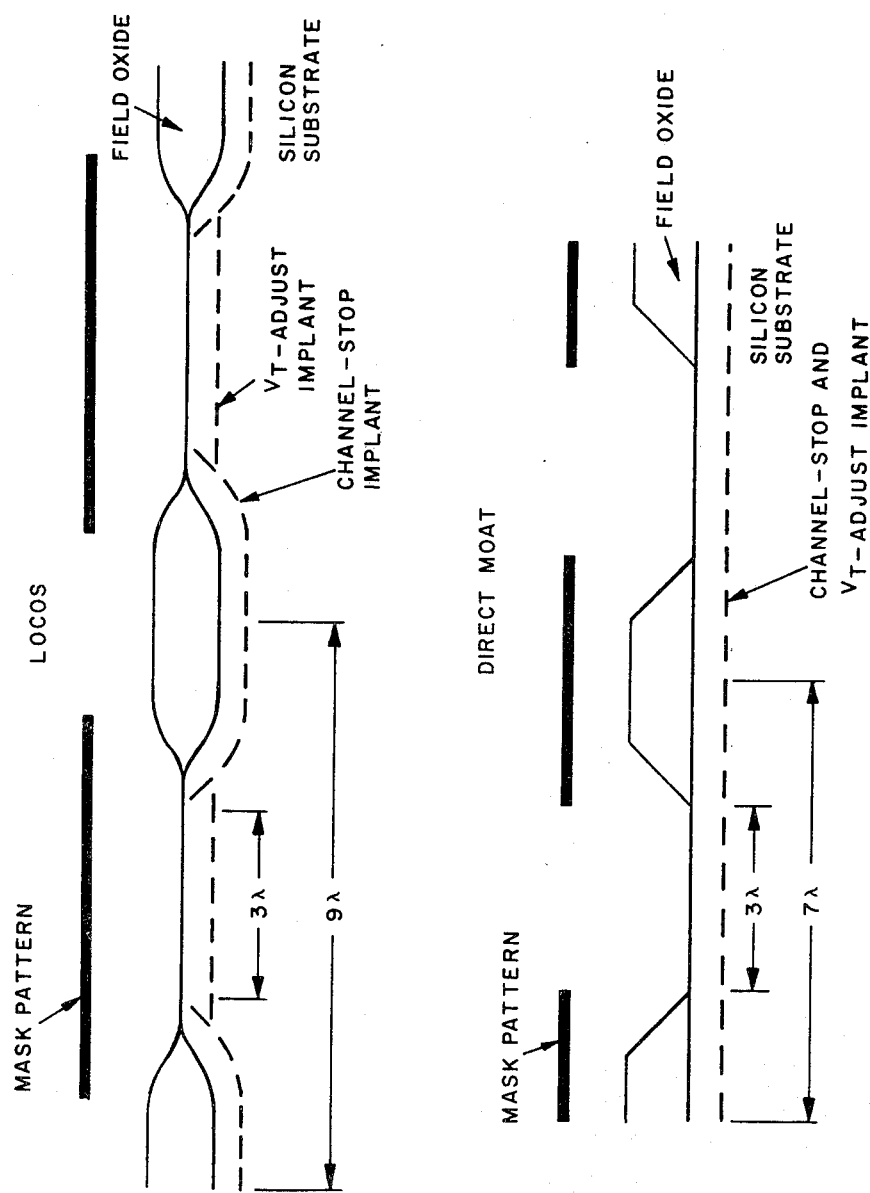
FIG. 9 generally compares direct moat and LOCOS isolation technologies.

FIG. 2 shows the cleared moat configuration resulting after application of the oxide etch. A thin gate oxide is then grown (or deposited), polysilicon is deposited conformally, and the polysilicon gates are patterned as shown in FIG. 3. Etching of the patterned polysilicon layer then begins, as shown in FIG. 4. FIG. 5 shows the configuration of the remaining polysilicon, when the moat area has been almost entirely cleared. Note that substantial polysilicon filaments remain adjacent to the moat sidewalls. To clear these filaments, where the sidewall angle is steep, substantial overetching is required. To accomplish this overetching, a poly etch which is both high selective over the gate oxide and anisotropic despite overetch is used.

For example, where a 90° vertical moat wall has been cut into a 750 nm field oxide, deposition of a 500 nm layer of polysilicon overall will result in a maximum polysilicon thickness of 1 to $1\frac{1}{4}$ microns at the sidewall. This depth must be cleared by anisotropic overetching alone, if the line width of the gate pattern is to be maintained. Thus, a worst case of 150% overetch past clear is required. Depending on the gate oxide thickness, the requisite selectivity of polysilicon (or polycide) over gate oxide can be calculated, to permit this substantial overetch without cutting through the gate oxide into the silicon substrate. Assuming film and etch uniformity, the selectivity which is required to completely clear the polysilicon filaments at the moat sidewall just before the gate oxide is etched through is equal to the thickness of the oxide step divided by the gate oxide thickness. Thus, for a gate oxide of 50 nm and field oxide of 750 nm, the minimum required selectivity is 15; and for a gate oxide of 25 nm, the minimum required selectivity is 30. In practice, the minimum selectivity is further increased by the normal variations in film thickness and in etch uniformity. For a typical variation of 10% in each, the required minimum selectivity is increased to 18 for a 50 nm gate oxide and to 36 for a 25 nm gate oxide.

This selectivity is achieved, in the presently preferred embodiment, by use of 100 sccm (standard cubic cm per minute) of chlorine at 200 microns of pressure. RF power at 100 kilohertz is applied at 100 watts, resulting in selectivity of about 100 to 1. Preferably hard masking is used for the polysilicon patterning. However, if hard masking is not used, a large admixture of helium is used (and the total pressure is thereby increased), to increase resist survival. The presently preferred poly etch has the further advantage of excellent anisotropy, so that undercutting of the gate pattern during the overetch cycle is avoided. This etch has been made public by the Perkin-Elmer Corporation, and other known etches having adequate selectivity and anisotrophy can alternatively be used.

The remainder of processing proceeds according to conventional methods. After the sources and drains have been formed, the multi-level oxide (such as phosphosilicate glass) is deposited and reflowed. The contact holes and vias are then etched, using a not too anisotropic etch, and the metallization (e.g. aluminum) is deposited and patterned. Finally, the protective overcoat layer is deposited and patterned, completing processing.

Thus, the combination of a polymer-free anisotropic and selective oxide etch with an extremely selective polysilicon etch permits formation of extremely compact direct moat isolation structures.

It will be obvious to those skilled in the art that a wide range of equivalents may be substituted into the process of the present invention.

What is claimed is:

1. A process for forming integrated circuit device structures, comprising the steps of:
   providing a silicon substrate;
   forming a uniform oxide layer on said substrate;
   etching windows in said oxide to expose selected moat regions of said substrate;
   forming a thin gate oxide layer within said respective moat regions;
   depositing polysilicon on exposed surfaces;
   patterning said polysilicon to define selected gate regions within said moat regions;
   etching said polysilicon where exposed by said gate patterning step;
   forming a plurality of respective sources and drains within respective ones of said moats; and
   forming a plurality of respective contacts to respective ones of said sources, drains, and gates,
   wherein said oxide etch is anisotropic and selective over silicon, and does not deposit substantial quantities of polymers in said moat regions;
   and wherein said polysilicon etch is anisotropic and has a selectivity over oxide which is greater than 15;
   whereby an MOS integrated circuit structure is formed.

2. The process of claim 1, further comprising the step of:
   implanting said substrate with a field threshold/device threshold implant, prior to formation of said oxide layer.

3. The process of claim 2,
   wherein said substrate comprises a first conductivity type, and said implant comprises an additional concentration of said first conductivity type.

4. The process of claim 1, wherein said oxide etch comprises plasma etching in a mixture of $CHF_3$ and $C_2F_6$.

5. The process of claim 1, wherein said polysilicon patterning step comprises applying a patterned layer of a hard mask material.

6. The process of claim 5, wherein said hard mask material comprises silicon nitride.

7. The process of claims 1, 2, 3, 4, 5, or 6, wherein said polysilicon etch comprises applying RF power in an atmosphere comprising chlorine.

8. The process of claim 7, whrein said atmosphere consists essentially of chlorine.

9. The process of claim 8, wherein said atmosphere consists of chlorine.

* * * * *